United States Patent [19]

Bringmann et al.

[11] Patent Number: 5,112,649
[45] Date of Patent: May 12, 1992

[54] METHOD OF DEPOSITING MICRO-CRYSTALLINE SOLID PARTICLES BY HOT FILAMENT CVD

[75] Inventors: Udo Bringmann, Halstenbek; Claus-Peter Klages, Hamburg; Rolf Six, Hennstedt-Ulzburg; Lothar Schafer, Hamburg, all of Fed. Rep. of Germany

[73] Assignee: U.S. Philips Corporation, New York, N.Y.

[21] Appl. No.: 603,579

[22] Filed: Oct. 25, 1990

[30] Foreign Application Priority Data

Oct. 27, 1989 [DE] Fed. Rep. of Germany ....... 3935865

[51] Int. Cl.⁵ .................. C23C 16/00; B05D 3/14
[52] U.S. Cl. .................................. 427/249; 427/49; 427/50; 427/122; 427/248.1; 427/314; 427/255.1
[58] Field of Search ............... 427/249, 49, 50, 248.1, 427/314, 122, 255.1; 423/446; 118/724

[56] References Cited

U.S. PATENT DOCUMENTS 4,958,592  9/1990  Anthony et al. ............... 118/724
4,988,421  1/1991  Drawl et al. ................. 204/192.3

Primary Examiner—Shrive Beck
Assistant Examiner—Roy V. King

[57] ABSTRACT

Method of depositing micro-crystalline solid particles from a vapor phase containing a carbonaceous gas using chemical vapor deposition (CVD), in which the solid particles to be deposited are deposited at a pressure in the range from $10^{-5}$ to 1 bar onto a substrate which has been heated to a temperature in the range from 450° to 1200° C. and in which the chemical vapor phase reactions are effected in the gas phase which is thermally energized by means of a resistance heat conductor, a resistance heat conductor made of a carbide of at least one transition metal from the secondary group IVa to VIa of the periodic element system (PSE) with a carbon content which substantially corresponds to a stoichiometrical composition of the carbide and having a melting point of >2000° C. being used.

8 Claims, No Drawings

METHOD OF DEPOSITING MICRO-CRYSTALLINE SOLID PARTICLES BY HOT FILAMENT CVD

BACKGROUND OF THE INVENTION

The invention relates to a method of depositing microcrystalline solid particles from a vapor phase containing a carbonaceous gas chemical vapor deposition (CVD), in which the solid particles to be deposited are deposited at a pressure in the range from $10^{-5}$ to 1 bar onto a substrate which has been heated to a temperature in the range from 450° to 1200° C. and in which the chemical vapor phase reactions are effected in the gas phase which is thermally excited by means of a resistance heat conductor.

The deposition of micro-crystalline solid material from the gas phase using chemical vapor deposition is used for a wide range of applications for producing self-supporting preforms or also for forming coats on different types of substrates.

Generally, it is a characteristic of a CVD-process that a mixture of gases interacts with a substrate surface at a relatively high temperature while decomposing at least one gas forming part of the gas mixture and the depositing of a reaction product in the solid state on the upper surface of the substrate. The conventional CVD-process requires high temperatures, reactive gases and an arrangement suitable to perform such a method. Typical process parameters are temperatures in the range from 450° to 2500° C., pressures in the range from $10^{-5}$ to 1 bar and a process gas mixture of at least one reactive gas and additional gases such as inert, oxidizing or reducing gases.

The reaction product (solid particles) are correspondingly obtained by

| | |
|---|---|
| pyrolysis | (for example. $CH_3SiCl_3 \rightarrow SiC + 3HCl$) or |
| reduction | (for example: $WF_6 + 3H_2 \rightarrow W + 6HF$) or |
| oxidation | (for example: $SiH_4 + O_2 \rightarrow SiO_2 + 2H_2$) or |
| co-reduction | (for example: $TiCl_4 + 2BCl_3 + 5H_2 \rightarrow TiB_2 + 10HCl$). |

Energizing the process gas mixture within the reactor is effected in an excitation zone (gas phase range with maximum energy content), which, for example, be formed over a plasma, can be produced by coupling-in microwave or high frequency energy or energy from an electric d.c. voltage field, over a wire heated by current flow or over a flame. In the excitation zone the gas phase reactions are stimulated and subsequently there occurs a precipitation of the reaction products onto the substrate which preferably is positioned at some distance from the excitation zone, which substrate is arranged on a substrate holder which is temperature-controlled in a conventional manner. The residual gases are removed from the reactor by means of a vacuum pump.

Jap. J. Appl phys. 21 (1982), Nr. 4, pages L183 to L185 schematically shows in FIG. 1 an arrangement for depositing diamond particles using CVD from a methane/hydrogen vapor phase, in which the reaction gas mixture is energized by a resistance heat conductor constituted by a tungsten filament heated to a temperature of approximately 2000° C.

In trials performed within the framework of the invention for the deposition of polycrystalline diamond layers using a CVD-process it was found that the material of the resistance heat conductor (preferably molybdenum, tungsten or tantalum) becomes brittle under process conditions (hydrocarbon gas/hydrogen-atmosphere, temperatures over 2000° C.) within a very short period of time (after approximately 10 h process duration) and spontaneously break when they are slightly shaken or touched. The Ep-A2 272 418 discloses, for example, such a method and an arrangement suitable therefor. Therein, using a thermal CVD-process diamond particles are deposited from a carbon/hydrogen atmosphere onto a substrate which is heated to a temperature in the range from 1000° to 2500° C. and consists of a high melting metal or carbon, the reaction gas being excited by means of a tungsten heat conductor having a temperature of 2000° C.

Because it is so simple, this method, in which the gas phase is excited via a heated resistance wire (alternatively denoted "filament method" in the relevant literature), is at present one of the most widely used processes for producing diamond coats. The linear rate of growth is in the order of magnitude of 1 μm/h, when methane is used as the carbonaceous gas. The deposition rate can be increased by approximately one order of magnitude when other organic compounds are used as carbon suppliers for the reaction gas mixture, for example, alcohols, ethers, ketones, amines. However, it was found in these processes that a continuous process duration of approximately 10 h can hardly be exceeded, when the ordinarily used resistance heat conductors of high-melting metal such as tungsten, molybdenum and tantalum are employed. This is because these conductors become embrittled (as has been described) during this process duration.

This embrittlement is caused by the fact that the metals of the resistance heat conductor chemically react with the reactive gas phase, for example a forming carbide, and the attendant structural changes in the resistance heat conductor then result in unwanted mechanical instabilities. Consequently, when resistance heat conductors made of high-melting metals are used it is recommended to exchange them after a relatively short process duration, which means that the deposition procedure must be interrupted and it is then hardly possible to produce homogeneous solid particle layers of a greater thickness ( >100 μm) in a continuous process or to deposit a plurality of thin solid particle layers one after the other without exchanging the resistance heat conductor.

The invention has for its object to improve the method defined in the opening paragraph for depositing micro-crystalline solid particles from a gas phase containing carbonaceous gas by means of CVD to such an extent that a longer continuous process duration can be achieved, without the necessity of exchanging the resistance heat conductor.

According to the invention, this object is accomplished in that a resistance heat conductor made of a carbide of at least one transition metal of the secondary group IVa to VIa of the periodic table of the elements (PTE) with a carbon content which substantially corresponds to a stoichiometrical composition of the carbide and having a melting point of >2000° C. is used.

DETAILED DESCRIPTION OF THE INVENTION

In accordance with an advantageous further development of the method of the invention, a resistance heat conductor is used which is made of a carbide or a mixed carbide of the transition metals titanium, zirconium, hafnium, vanadium, niobium, tantalum, molybdenum and/or tungsten.

The formation of carbides from high-melting metals from the secondary groups IVa to VIa of the periodic table of the elements and also how to process them further are known (cf. Ullmanns Encyklopaedie der technischen Chemie, 3rd edition 1954). Care should be taken however that carbides having a content of bound carbon which at least substantially, if possible fully corresponds to the stoichiometrical composition are used as the starting material for the resistance heat conductor. Mechanically extremely stable preforms having a density of at least 88% can be formed from such carbide powders by, in particular, hot isostatic pressing, which after pressing can be subjected to a further mechanical treatment step, so that resistance heat conductors having a suitable desired shape can be produced without difficulties. It is of course also possible to use deformation techniques other than those known from powder metallurgy for the production of resistance heat conductors.

In accordance with further advantageous embodiments of the method of the invention carbide or diamond particles are deposited as solid particles.

In accordance with further advantageous embodiments of the method according to the invention, diamond crystals can be deposited from a gas containing hydrogen and <30% of carbonaceous gas, preferably hydrocarbon gases such as those containing methyl groups.

The invention has the advantages that when a resistance heat conductor in accordance with the invention is used, it is not only possible to effect CVD-deposition processes having a continuous process duration of more than 10 hours, with which homogeneous layers can be obtained from the deposited solid particles of a correspondingly greater thickness, but the processes can also be effected in their totality at a lower cost. This is because of the prolonged operating life of the resistance heat conductor exchanging of the resistance heat conductor is not so often required as in the prior art method in which a filament of a high-melting metal (for example tungsten, molybdenum or tantalum) which chemically reacts with the reactive gas phase is used.

A further advantage is that the resistance heat conductors made of carbides or mixed carbides can be produced by means of all the manufacturing procedures known from powder metallurgy. Resistance heat conductors of, for example, carbides which are deformed by hot isostatic pressing are mechanically extremely stable and can have any desired shape, more specifically a large shape, so that using them a correspondingly uniform heating of a large area of the excitation zone in a CVD-reactor can be effected.

The use of a resistance heat conductor made of tungsten carbide in a CVD-process for the deposition of polycrystalline diamond particles onto a tungsten substrate will be described as an embodiment of the invention.

A resistance heat conductor having a diameter of 1 mm and a length of 50 mm, made from tungsten carbide in a sintering process is first heated during 3 hours to a temperature of 2500° C. in a gas mixture of 1% methane and 99% hydrogen at a pressure of approximately 66 mbar by direct current flow, to remove impurities, during which process binding and/or sintering auxiliary agents as well as volatile impurities are removed from the resistance heat conductor. Immediately thereafter this resistance heat conductor is mounted in a CVD-reactor for the deposition of polycristalline diamonds instead of the customarily used heater filament of a high-melting metal. Osing a resistance heat conductor of tungsten carbide, the same results (for example deposition rate, morphology) were obtained in CVD-processes for the deposition of polycrystalline diamond layers as when a spiralized tantalum wire is used to excite the reaction gas phase. Using a resistance heat conductor of tungsten carbide, at least 12 deposition processes having a duration of 7 hours on an average were performed, without the heat conductor having lost any of its mechanical stability. Tantalum wires evidenced such an embrittlement even after a process duration of 10 hours under the same conditions that they readily broke to pieces when they were subjected to a very low degree of mechanical shock.

The deposition process was effected using the following parameters:

process gas mixture: 0.5 % methane in hydrogen;
operating temperature of the resistance heat conductor: 2200° C.;
total flow-rate of the process gas mixture: 200 sccm;
overall pressure in the reactor: 40 mbar;
temperature of the substrate surface: 850° C.;
thickness of the deposited diamond layer after a continuous process
duration of 7 hours: 5 μm.

We claim:

1. A method of depositing micro-crystalline solid particles from a vapor phase containing a carbonaceous gas, using chemical vapor deposition (CVD), in which the solid particles to be deposited are deposited at a pressure in the range from $10^{-5}$ to 1 bar onto a substrate which has been heated to a temperature in the range from 450° to 1200° C. and in which the chemical vapor phase reactions are effected in the gas phase which is thermally excited by means of a resistance heat conductor, the improvement wherein, a resistance heat conductor made of a carbide of at least one transition metal from the secondary group IVa to VIa of the periodic table of the elements (PTE) with a content of carbon which substantially corresponds to a stoichiometrical composition of the carbide and having a melting point of >2000° C. is used.

2. A method as claimed in claim 1, wherein, carbides are deposited as solid particles.

3. A method as claimed in claim 1, wherein, diamond crystallites are deposited as solid particles.

4. A method as claimed in claim 3, wherein the diamond crystallites are deposited onto the substrate from a gas phase containing hydrogen and less than 30% of a carbonaceous gas.

5. A method as claimed in claim 4, wherein, hydrogen to which 0.5% of a hydrocarbon gas is added is used as a gas phase.

6. A method as claimed in claim 5, wherein a hydrocarbon gases containing a methyl a group is used as the hydrocarbon gas.

7. A method as claimed in claim 6, wherein methane is used as the hydrocarbon gas.

8. A method as claimed in claim 7, wherein a resistance heat conductor is used which is made of a carbide or a mixed carbide of the transition metals titanium, zirconium, hafnium, vanadium, niobium, tantalum, molybdenum and/or tungsten.

* * * * *